US009229872B2

(12) United States Patent
Wilkerson et al.

(10) Patent No.: US 9,229,872 B2
(45) Date of Patent: Jan. 5, 2016

(54) SEMICONDUCTOR CHIP WITH ADAPTIVE BIST CACHE TESTING DURING RUNTIME

(71) Applicants: Christopher Wilkerson, Portland, OR (US); Jawad Nasrullah, Palo Alto, CA (US); Kelvin Kwan, Santa Clara, CA (US)

(72) Inventors: Christopher Wilkerson, Portland, OR (US); Jawad Nasrullah, Palo Alto, CA (US); Kelvin Kwan, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 301 days.

(21) Appl. No.: 13/843,639

(22) Filed: Mar. 15, 2013

(65) Prior Publication Data

US 2014/0281254 A1    Sep. 18, 2014

(51) Int. Cl.
*G06F 12/08*      (2006.01)
(52) U.S. Cl.
CPC .................................. *G06F 12/0891* (2013.01)
(58) Field of Classification Search
None
See application file for complete search history.

(56) References Cited

U.S. PATENT DOCUMENTS

| 6,502,044 | B1 * | 12/2002 | Lane et al. | 702/63 |
| 8,358,548 | B2 * | 1/2013 | Manna et al. | 365/200 |
| 8,379,466 | B2 * | 2/2013 | Zhang et al. | 365/200 |
| 2006/0259840 | A1 * | 11/2006 | Abadeer et al. | 714/733 |

OTHER PUBLICATIONS

Wilkerson et al., "Trading off Cache Capacity for Reliability to Enable Low Voltage Operation", Jun. 21-25, 2008, Computer Architecture, 2008, ISCA,08 35th International Symposium, p. 203-214.*

* cited by examiner

*Primary Examiner* — Aimee Li
*Assistant Examiner* — Tracy Chan
(74) *Attorney, Agent, or Firm* — Nicholson De Vos Webster & Elliott, LLP

(57) ABSTRACT

A method is described that includes during runtime of a semiconductor die, determining that a next BIST test sequence of a storage component embedded on the die is appropriate. The method further includes applying a BIST test sequence to each valid entry in the storage component. The method also includes marking any newly invalid entries in the storage component as invalid and configuring a respective replacement entry for each of the newly invalid entries.

23 Claims, 5 Drawing Sheets

US 9,229,872 B2

SEMICONDUCTOR CHIP WITH ADAPTIVE BIST CACHE TESTING DURING RUNTIME

BACKGROUND

Semiconductor chips or single packages containing multiple semiconductor chips often include one or more caching layers to keep information localized to the circuits that are processing the information. By keeping the information localized overall system operation is improved because slower external accesses for the information (e.g., off die or outside the package) are avoided.

Besides performance, another consideration is power consumption. Here, generally, a power efficient chip/package as opposed to a power hungry chip/package is desirable. One technique for reducing power consumption of a semiconductor chip is to reduce its supply voltage. Here, for a same clock frequency, the power consumption of a chip having a lower supply voltage will consume less power than a semiconductor chip having a higher supply voltage.

FIGURES

The following description and accompanying drawings are used to illustrate embodiments of the invention.

DETAILED DESCRIPTION

A problem is that if the supply voltage of a semiconductor chip having cache circuitry is lowered too much, the cache will begin to "lose" its information. This can be particularly troublesome if the cache is holding the only valid version of a specific data item. An additional problem is that caches can demonstrate "wear out" problems over the course of their lifetime. For example, a cache may begin to lose its information at a lower supply voltage after extended usage over elevated temperatures.

Generally, the former problem (data loss because of too low a supply voltage) has been addressed by running a semiconductor chip at a supply voltage level that is guard-banded above a level where the cache circuitry might otherwise be able to operate without losing information, while the later problem (storage cell wear-out) has been addressed with the use of error correction codes (ECC codes).

In the case of ECC coding, an ECC code is generated from the specific data pattern of a unit to be stored in a cache. The generated ECC code is then stored along with a unit of data in the cache. When the data is read from the cache, its corresponding ECC code is read along with it. A second ECC code is then generated from the data just read from cache and the two ECC codes are compared (i.e., the ECC code generated from the read data is compared to the ECC code that was stored with the data). If the ECC codes match the data is deemed correct. If the ECC codes do not match the data is recognized as being corrupted, however, the correct data may be recoverable based on an analysis of the two ECC codes and the data that was just read.

Guard-banding the supply voltage essentially causes the chip to consume more power that it otherwise could consume and still operate properly (because the guard-band is set at an overly safe level). ECC coding corresponds to less utilized cache space because some percentage of the chip's storage cells are used to store ECC codes rather than the actual data being processed by the system (some codes may be half as wide as the data unit they refer to which corresponds to 33% of a cache's storage cells being used to store ECC code information rather than true data).

Figure 1:
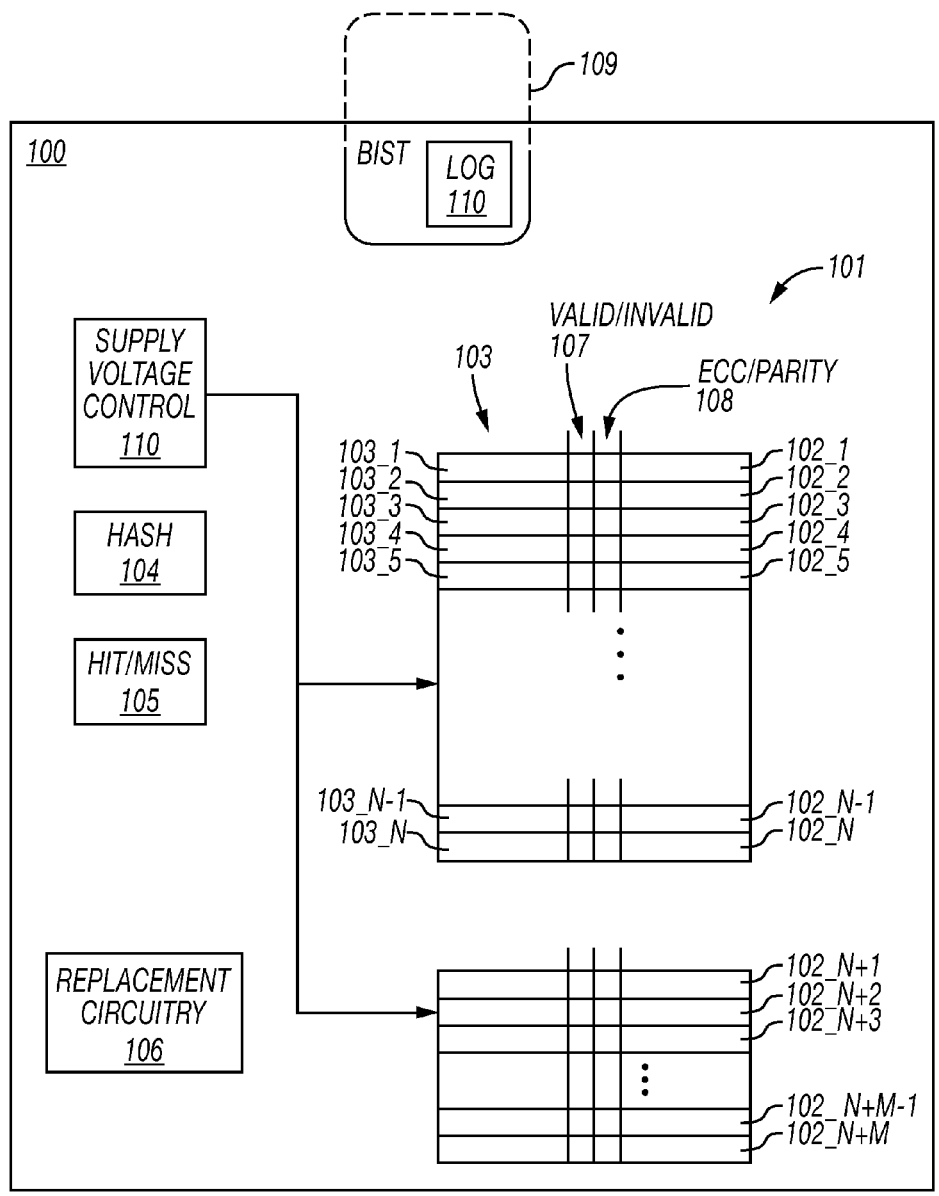
FIG. 1 shows a depiction of a semiconductor chip having a cache.

FIG. 1 pertains to a new approach that de-emphasizes both extensive supply voltage guard-banding and extensive ECC coding implementation. As observed in FIG. 1, a semiconductor chip 100 has caching storage circuitry 101 which includes a number of entries or storage locations 102_1 through 102_N for storing units of data (e.g., cache lines). Depending on implementation each entry may include room to store, apart from the true data, substantially fewer ECC bits, a single parity bit or perhaps no ECC or parity bits.

In the case of an associative cache, such as an N-way set associative cache, each entry 102_1 through 102_N is typically identified by a "tag" 103_1 through 103_N which corresponds to the higher ordered bits of the system memory address of the entry's data item. The general location of the data item within the overall cache, e.g., the set it belongs to, is typically determined by performing a hash function (with hash circuit 104) on the data item's system memory address (where the hash function will not map two system memory addresses having identical higher ordered bit patterns to the same set).

Each set typically has a plurality of associated entries that correspond to different offsets within the set. As items to be cached map to a same set, they fill up the offsets in sequence. Once the set is filled any more entries that map to the set may cause the eviction of one of the data items within the set. Items are retrieved from the cache by performing the same hash on the system memory address of the desired data item which maps to the specific set the data item would be stored in the cache if it is stored there. Cache hit/miss circuitry 105 checks the higher ordered bits of the desired data's system memory address with the tag values in the set. If there is a match (a "hit") the data item associated with the matching tag in the cache is the looked for data.

An additional set of reserve storage entries 102_N+1 through 102_N+M are included in the caching storage circuitry 101. Here, each reserve storage entry 102_N+1 through 102_N+M acts as a redundant entry to any of entries 102_1 through 102_N. That is, if any of entries 102_1 through 102_N is detected as being "bad", one of entries 102_N+1 through 102_M is chosen as its replacement. Here, replacement circuitry 106 is responsible for coordinating which replacement entry is used in place of a particular bad entry amongst entries 102_1 through 102_N.

As observed in FIG. 1, each entry in entries 102_1 through 102_N+1 has an additional bit 107 that indicates whether the entry is bad or not. In operation, if one of entries 102_1 through 102_N+1 is deemed bad, the state of the bit within bit location 107 is flipped to indicate the entry is bad. Replacement circuitry 106 helps establish which entry of entries 102_N+1 through 102_N+M is to be used as its replacement (in a basic approach, the hashing function plays a role in the determination). If a cache snoop is made to a set having a bad cache entry, the bad cache entry is detected by way of the set bit in bit location 107 and reference is made instead to its replacement within one of entries 102_N+1 to 102_N+M.

Here, replacement circuitry 106 may keep a map or some other state information that records the replacement entries for the various bad entries, and/or, logical function (such as a hashing function logic) that automatically determines which replacement entry is to be used based on the cache's line's system memory address. It is also possible that a bad entry within the replacement entries can be marked by way of bit location 107 and replaced with another replacement entry.

The amount of additional error detection information 108 that is stored along with the true data of each entry may vary from embodiment to embodiment, but, is less than what an extensive, large ECC code implementation would consume so that the overhead associated with the ECC is not substantial. For example, in one embodiment, no parity or ECC of any kind is used (i.e., information 108 does not exist), in another embodiment only a parity bit is used, in yet another embodiment a limited (smaller) ECC code is appended with each entry (e.g., only a byte of ECC code for every eight bytes of true data).

The de-emphasis on the amount of error detection/correction information 108 kept within the cache 101 is compensated for with built-in self test (BIST) operations performed on the cache 101 by a BIST controller 109. The BIST controller 109 may be implemented in software (e.g., with firmware executed on a micro-controller embedded on the die and/or another die), hardware (e.g., dedicated logic circuitry) or a combination of the two.

The BIST controller 109, as explained in more detail below, monitors the reliability of the cache's underlying storage circuitry at various instances over the run-time of the system and disables any detected bad entries and, with the help of replacement circuitry 106, replaces it with a replacement entry as described above. Accordingly, the BIST controller essentially implements adaptive BIST testing (i.e., BIST tests and entry replacements are performed over the run time life of the system) whereas, traditionally, BIST testing with bad entry replacement has been "static" (i.e., performed only once at system power-up and/or after system manufacturing).

In combination with adaptive BIST testing and bad cache entry replacement, the cache's supply voltage (as well as the die circuitry on the die) is dropped to a sub guard band level to reduce the overall power consumption of the die. Ideally, the supply voltage is lowered to a level just above (rather than a large guard banded level above) where the cache's storage circuits will begin to produce errors in the stored data. As the lowered supply voltage may cause certain cache entries to exhibit degradation sooner, the regular adaptive BIST testing over the run time of the system will catch these entries and replace them.

Figure 2:
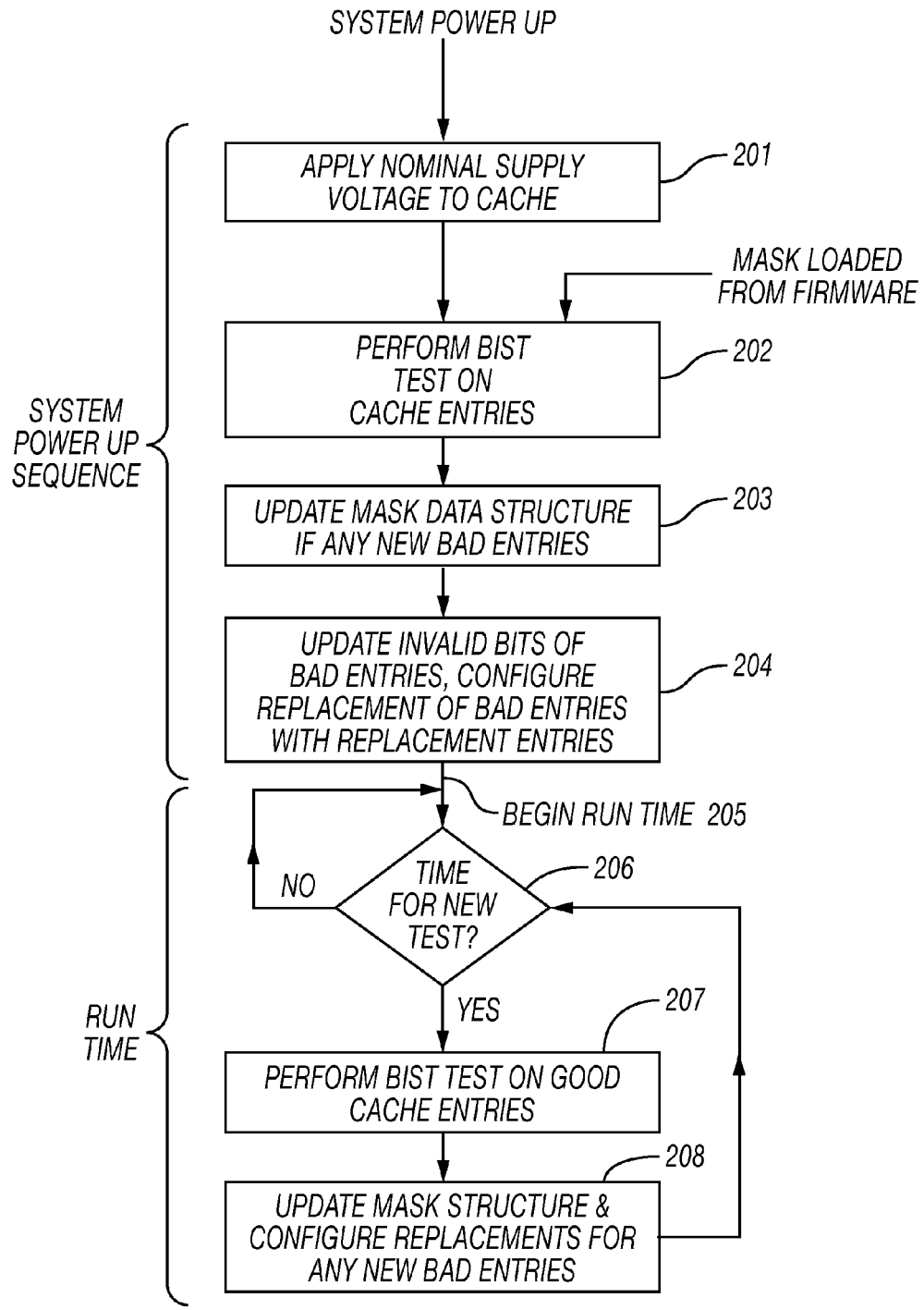
FIG. 2 shows a methodology performed by a system having the semiconductor chip of FIG. 1.

FIG. 2 shows an illustration of a methodology for a system designed as described above. As observed in FIG. 2, upon system power up, a nominal supply voltage (e.g., as provided/defined by firmware) is provided to the die including the cache 201. In an embodiment, the supply voltage corresponds to the lowest supply voltage the cache is expected to operate at while the system is operating. In an embodiment, this supply voltage is determined in view of the trend 300 observed in FIG. 3 which is explained in more detail further below.

In an embodiment, firmware or other non volatile memory (e.g., on die, off die or a combination of both) stores a mask data structure that identifies good and bad entries in the cache for an ensuing BIST test sequence 202. The mask data structure, or a separate data structure (e.g., stored within non volatile memory on the die) may also identify which bad entries are replaced with which replacement entries. In an embodiment, the replacement circuitry 106 refers to this information at power up to set the invalid bit 107 of those entries that are bad and coordinate whatever internal mechanism is used to cause a cache snoop to refer to a bad entry's replacement.

With respect to the identification of bad entries, in the case of a fairly new system, the mask data structure may mostly (if not entirely) reflect which entries were originally detected as bad when the system was initially manufactured. As the system matures and is regularly used over time, certain additional entries may be identified as bad in the mask data structure (which, e.g., is stored in non volatile firmware memory as part of the power down process). In an embodiment, the power-up BIST test 202 only tests those cache entries listed as "good" in the mask data structure. Any previously identified good entries that are newly found to be bad are recorded into the mask data structure to update the mask data structure 203. In an embodiment, the test is performed by writing a specific pattern into a cache entry, reading the entry back, and then comparing it against the known originally written pattern. If there is a mismatch the entry is marked as bad. Conceivably more than one test pattern can be used per cache entry. That is, a test for a single entry may include multiple write, read back and comparison sequences.

The updated mask data structure is then downloaded to the replacement circuitry 106 which newly sets invalid bit 107 for the newly identified bad entries and identifies/coordinates or otherwise configures the use of replacement entries for them 204. The system then begins runtime 205. In an embodiment, in order to reduce overall power consumption of the die having the cache, the supply voltage at run time can be lower than where a guard-banded supply voltage would otherwise be.

Figure 3:
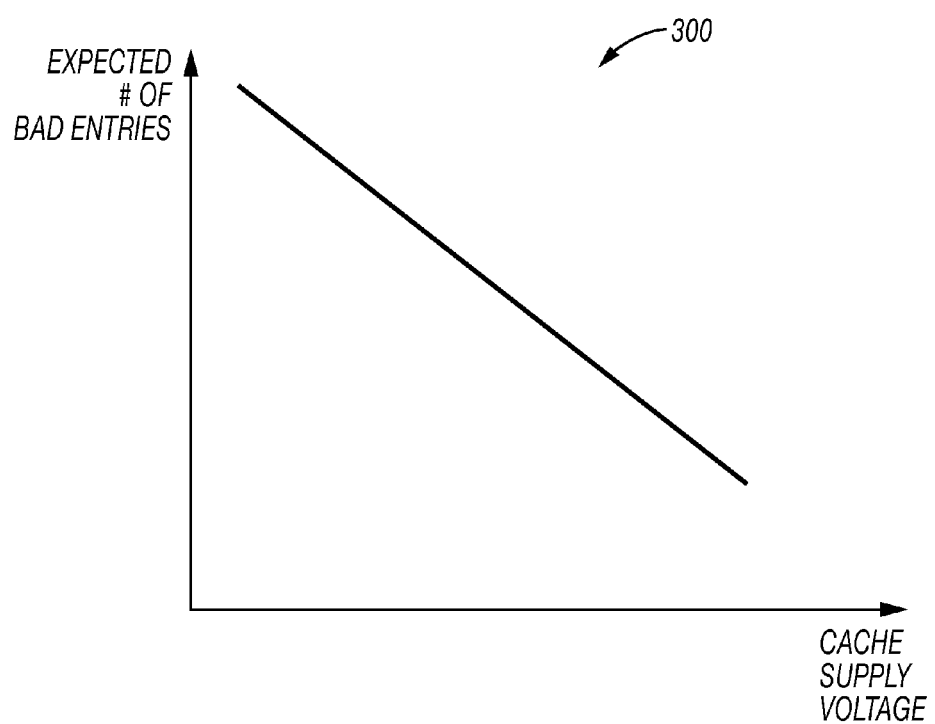
FIG. 3 shows an expected number of defective cache entries as a function of cache supply voltage.

FIG. 3 shows a graph 300 of the expected number of "bad" cache entries as a function of cache supply voltage. The graph 300 of FIG. 3 may be generated based on previously taken data and/or theoretical work. Essentially the graph 300 of FIG. 3 provides an estimate of how many bad cache entries (or a density thereof) can be expected as function of cache supply voltage. This understanding, combined with an understanding of the size of the replacement entry pool, can be used by the system to establish cache size vs. supply voltage tradeoffs. As system performance is correlated to cache size (the larger the cache the greater the system performance), the trend 300 of FIG. 3 can be used to establish a power consumption v. performance tradeoff. That is, with higher cache supply voltages larger caches can be entertained and therefore greater system performance realized at the expense of greater power consumption, whereas, with lower cache supply voltages only smaller caches can be entertained and therefore only lesser system performance realized but with the savings of reduced power consumption. Therefore, based on this type of analysis, the system can determine for itself (e.g., based on user input) what the appropriate cache supply voltage should be.

Referring back to FIG. 2, with a supply voltage being established for the cache and perhaps the surrounding die circuitry as well, the adaptive BIST function of the controller 109 regularly tests 206, 207 the entries previously marked as "good" to see if they exhibit signs of degradation. Here, in an embodiment, the controller 109 will read a cache entry and store it locally (e.g., in reserve storage space (e.g., a register or memory circuit) of the controller 109). Then the controller will commence testing of the cache entry similar to the manner discussed above at process 202.

If the entry fails the test, the controller 109 updates the data mask structure to reflect the new bad entry and notifies the replacement circuitry so it can configure a replacement for the cache entry 208. The mask data structure is referred to again upon the next BIST test sequence 206, 207, 208. Each new mask data structure may be stored in non volatile memory (external to the die or external to the die), e.g., upon its creation, so it can be referred to upon a next power up sequence of the die.

In an embodiment, whether it is appropriate to run a new memory test depends on how long the cache has operated in its current state as compared to a log record of the state of the cache during its past tests 110. Here, the log 110 may be kept in external memory or internal storage (register or memory) of the die 100. In an embodiment, the controller 109 is configured at least initially to run tests periodically and record a timestamp, the temperature and the supply voltage at which the test was run. By monitoring the current temperature and supply voltage against the log's contents 110, the controller 109 can determine how much time has passed since the cache was last tested in the state it is presently in. The controller 109 may be configured to schedule tests more frequently for elevated temperatures and lower supply voltages than for lower temperatures and higher supply voltages. That is, the controller 109 will permit more time to elapse leading up to a next test if the cache is in a less strenuous state than if the controller is in a more strenuous state. The amount of permitted time between tests, in an embodiment, is less than the amount of time that the cache is expected to exhibit wear out effects in its current state.

Figure 4:
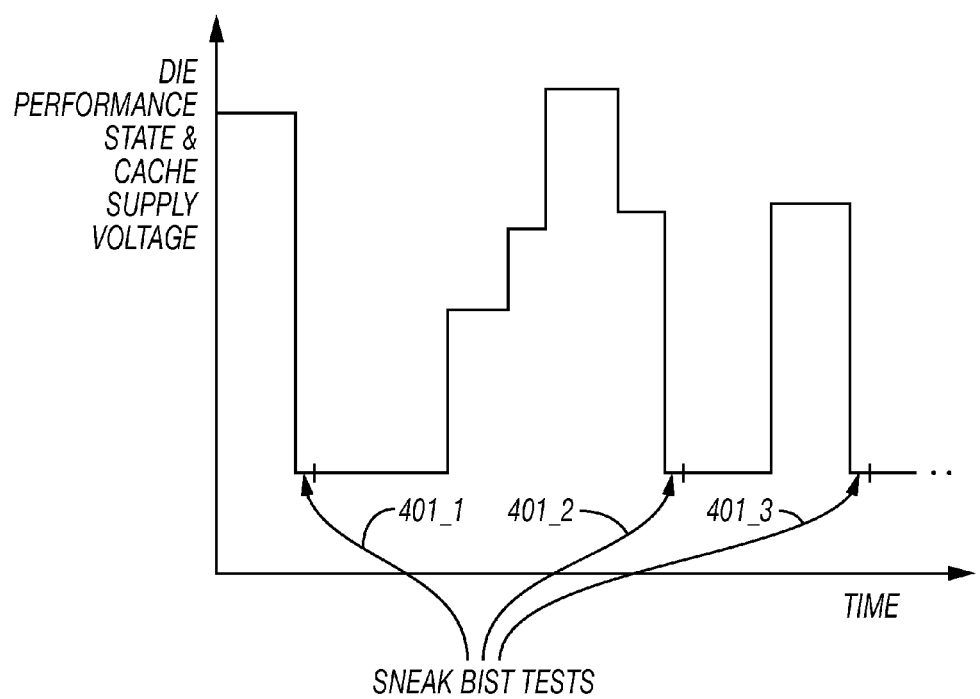
FIG. 4 shows a process for sneaking adaptive BIST cache tests during the runtime of a die.

In an embodiment, referring to FIG. 4, the controller "sneaks" tests 401_1, 401_2, 401_3 of the cache entries in periods of time when the die is in a low execution or performance state. For example, if the die is a multi-CPU core processor, the controller sneaks in the cache tests when the CPU cores are idle or at least not under a heavy workload. Notably, the lower (i.e., non guard-banded) supply voltage is applied to the cache when the die enters its low (e.g., lowest) performance state or power state (sleep mode).

In a further embodiment, if the controller 109 is not able to initiate a test when it desires to, which corresponds to a situation when the cache should be tested but cannot be, the controller 109, which is coupled to power management circuitry 111, causes the supply voltage on the cache to be raised to prevent the loss of information within the cache. Here, in an embodiment, the reduced (non guard-banded) cache supply voltage that was the focus of the above discussions are used mainly when the die is in an idle or lower performance state as an additional power savings. That is, the lower non guard-banded voltages are only applied to the cache when the die is a low performance state (e.g., a sleep mode). Thus, performing the BIST testing during idle/low performance state naturally corresponds to the lowered supply voltage that the memory tests are meant to discover bad entries from.

Figure 5:
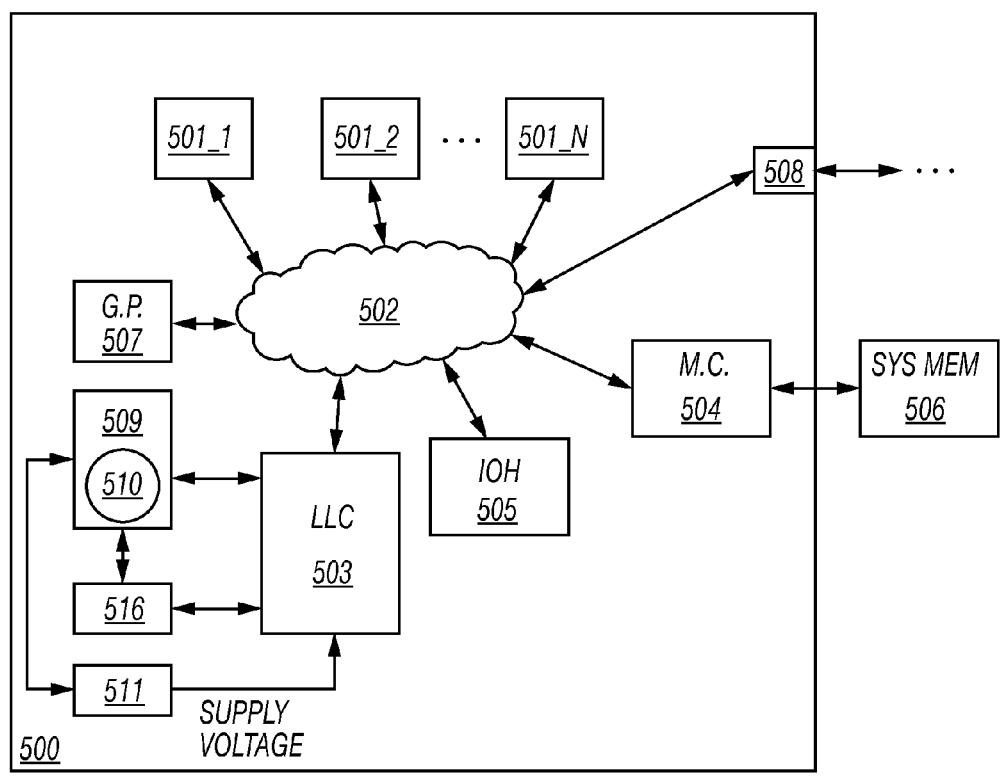
FIG. 5 shows a processor that can performed adaptive BIST testing of a cache during runtime.

FIG. 5 shows an exemplary multi-core processor that the 500. As observed in FIG. 5, the processor includes: 1) multiple processing cores 501_1 to 501_N; 2) an interconnection network 502; 3) a last level caching system 503; 4) a memory controller 504 and an I/O hub 505. Each of the processing cores contain one or more instruction execution pipelines for executing program code instructions. The processing cores also typically posses at least one of their own respective caches (not shown). The interconnect network 502 serves to interconnect each of the cores 501_1 to 501_N to each other as well as the other components 503, 504, 505.

The last level caching system 503 serves as a last layer of cache in the processor 500 before instructions and/or data are evicted to system memory 506. The memory controller 504 reads/writes data and instructions from/to system memory 506. The I/O hub 505 manages communication between the processor and "I/O" devices (e.g., non volatile storage devices and/or network interfaces). Port 508 stems from the interconnection network 502 to link multiple processors so that systems having more than N cores can be realized. Graphics processor 507 performs graphics computations. Other functional blocks of significance (phase locked loop (PLL) circuitry,) are not depicted in FIG. 5 for convenience.

Notably, the processor is observed to include a controller 509 with log 510 and replacement circuitry 516 associated with the last level cache 503 and power management circuitry 511. Each of these components may respectively operate as described above with respect to controller 109, replacement circuitry 106 and power management circuitry 111 of FIG. 1. These same components, or other respective sets of such components, may also be instantiated in the processor of FIG. 5 for any of the local caches within any of the cores 501_1 through 501_N. For example, core 501_1 may includes any of its own controller with log and replacement circuitry for its L1 and/or L2 caches. For simplicity such components are not shown in FIG. 5. The processor also includes register space 520 for setting, e.g., by a user, what the lowest cache supply voltage should be, e.g., in light of an expected number of invalid cache entries as a function of said cache supply voltage.

The above discussion focused on the use of replacement entries. That is, an "extra" set of cache entries that are made available for use only upon the detection of bad cache entry in the nominal cache storage space. As an alternative approach, there is no concept of "replacement" entries. Here, cache entries are simply marked as bad and removed from service. No effort is made to replace the bad cache entry with a new cache location. Notwithstanding this alternative approach, note the remaining principles and teaching discussed above still apply. That is, cache entries can be tested during run-time as discussed above and those marked as bad are not used going forward.

Although the above discussed has primarily focused on a cache and its cache entries, the principles discussed above can be applied to any kind of embedded storage on a die such as embedded system memory, register space or non volatile memory. Any of these (cache, system memory, register space or non volatile memory) can be referred to as a storage component. Each "entry" corresponds to a cache entry or a particular storage location as identified by its associated address.

As any of the logic processes taught by the discussion above may be performed with a controller, micro-controller or similar component, such processes may be implemented with program code such as machine-executable instructions that cause a machine that executes these instructions to perform certain functions. Processes taught by the discussion above may also be performed by (in the alternative to the execution of program code or in combination with the execution of program code) by electronic circuitry designed to perform the processes (or a portion thereof).

It is believed that processes taught by the discussion above may also be described in source level program code in various object-orientated or non-object-orientated computer programming languages. An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A semiconductor die, comprising:
   a cache having cache entries;
   replacement cache entries for invalid ones of said cache entries;
   replacement circuitry to configure replacement of said invalid ones of said cache entries with respective ones of said replacement cache entries; and
   a controller to perform built-in self test (BIST) operations on said cache entries during runtime and record in a log a timestamp, a temperature, and a supply voltage for each BIST operation.

2. The semiconductor die of claim 1 wherein the controller is to determine a supply voltage to the cache as a function of an expected number of invalid entries in said cache as a function of said supply voltage.

3. The semiconductor die of claim 2 further comprising register space to set a reduced supply voltage.

4. The semiconductor die of claim 1 wherein said controller is to track a time period over which said cache has endured a particular temperature and supply voltage combination.

5. The semiconductor die of claim 4 wherein said controller is to trigger a next BIST operation on said cache prior to an expected showing of degradation of said cache entries at said particular temperature and supply voltage combination.

6. The semiconductor die of claim 1 further comprising power management circuitry to cause a reduced supply voltage to be applied during a low performance state of said semiconductor die.

7. The semiconductor die of claim 1 wherein each of said cache entries include respective information indicating whether the cache entry is valid or invalid.

8. The semiconductor die of claim 7 wherein said controller is to refer to a mask data structure to set said respective information of said cache entries.

9. A method, comprising:
   recording in a log a timestamp, a temperature, and a supply voltage for built-in self test (BIST) sequences of a storage component embedded on a semiconductor die;
   during runtime of the semiconductor die, determining that a next BIST sequence of the storage component embedded on the semiconductor die is to be performed from the log;
   performing a BIST sequence on each valid entry in the storage component;
   marking any newly invalid entries in the storage component as invalid; and
   configuring a respective replacement entry for each of the newly invalid entries.

10. The method of claim 9 wherein said storage component is any of:
    a cache;
    embedded system memory;
    register space; and
    non volatile memory.

11. The method of claim 9 wherein said determining that said next BIST sequence is to be performed is based on a temperature and a supply voltage being applied to said storage component.

12. The method of claim 9 further comprising applying a lower supply voltage to said storage component upon entering a low performance state, said lower supply voltage being applied to said storage component during said performing said BIST sequence.

13. The method of claim 9 further comprising recording said newly invalid entries in a mask data structure.

14. A non-transitory machine readable medium containing program code that when processed by an electronic processing system causes a method to be performed, said method comprising:
    recording in a log a timestamp, a temperature, and a supply voltage for built-in self test (BIST) sequences of a storage component embedded on a semiconductor die;
    during runtime of the semiconductor die, determining that a next BIST sequence of the storage component embedded on the semiconductor die is to be performed from the log;
    performing a BIST sequence on each valid entry in the storage component;
    marking any newly invalid entries in the storage component as invalid; and
    configuring a respective replacement entry for each of the newly invalid entries.

15. The non-transitory machine readable medium of claim 14 wherein said storage component is any of:
    a cache;
    embedded system memory;
    register space; and
    non volatile memory.

16. The non-transitory machine readable medium of claim 14 wherein said determining that said next BIST sequence is to be performed is based on a temperature and a supply voltage being applied to said storage component.

17. The non-transitory machine readable medium of claim 14 wherein said method further comprises applying a lower supply voltage to said storage component upon entering a low performance state, said lower supply voltage being applied to said storage component during said performing said BIST sequence.

18. The non-transitory machine readable medium of claim 14 wherein said method further comprises recording said newly invalid entries in a mask data structure.

19. A processor, comprising:
    a cache having cache entries;
    circuitry to mark invalid ones of said cache entries; and
    a controller to perform built-in self test (BIST) operations on said cache entries during runtime and record in a log a timestamp, a temperature, and a supply voltage for each BIST operation.

20. The processor of claim 19 wherein the controller is to determine a supply voltage to the cache as a function of an expected number of invalid entries in said cache as a function of said supply voltage.

21. The processor of claim 19 wherein said controller is to track a time period over which said cache has endured a particular temperature and supply voltage combination.

22. The processor of claim 21 wherein said controller is to trigger a next BIST operation on said cache prior to an expected showing of degradation of said cache entries at said particular temperature and supply voltage combination.

23. The processor of claim 19 further comprising power management circuitry to cause a reduced supply voltage to be applied during a low performance state of said processor.

\* \* \* \* \*